United States Patent [19]
Smayling et al.

[11] Patent Number: 5,811,850
[45] Date of Patent: Sep. 22, 1998

[54] LDMOS TRANSISTORS, SYSTEMS AND METHODS

[75] Inventors: Michael C. Smayling, Missouri City; Manuel L. Torreno, Jr., deceased, late of Houston, both of Tex., by Arlene K. Torreno, administratrix

[73] Assignee: Texas Instruments Incorporated, Dallas, Tex.

[21] Appl. No.: 617,431

[22] Filed: Mar. 13, 1996

Related U.S. Application Data

[62] Division of Ser. No. 324,057, Oct. 14, 1994, Pat. No. 5,585,294.

[51] Int. Cl.$^6$ ................................................ H01L 29/78
[52] U.S. Cl. ...................... 257/335; 257/336; 257/343; 257/346
[58] Field of Search .................................. 257/335, 336, 257/343, 345, 346

[56] References Cited

U.S. PATENT DOCUMENTS

| | | | |
|---|---|---|---|
| 4,914,047 | 4/1990 | Seki | 437/41 DM |
| 5,229,633 | 7/1993 | Fisher | 257/343 |
| 5,242,841 | 9/1993 | Smayling et al. | 437/29 |
| 5,286,995 | 2/1994 | Malhi | 257/343 |
| 5,296,393 | 3/1994 | Smayling | 437/34 |
| 5,304,827 | 4/1994 | Malhi | 257/343 |
| 5,338,960 | 8/1994 | Beasom | 437/41 |
| 5,369,045 | 11/1994 | Ng et al. | 437/41 DM |
| 5,382,536 | 1/1995 | Malhi et al. | 437/41 DM |

*Primary Examiner*—Jerome Jackson
*Attorney, Agent, or Firm*—Gerald E. Laws; C. Alan McClure; Richard L. Donaldson

[57] ABSTRACT

A process for the fabrication of an improved LDMOS transistor, and such an improved LDMOS transistor are provided. The improved LDMOS transistor is in a semiconductor layer of a first conductivity type. The transistor has a source and drain of a second conductivity type (opposite the first conductivity type) and a channel of the first conductivity type with a conductive gate insulatively disposed over the channel. A low-voltage tank of the second conductivity type is used to contain the drain drift region and because of its lower sheet resistance provides a lower $R_{DS}$(on). This tank of the second conductivity type extends from the field oxide at the exterior perimeter of the drain region, joins with the channel region and extends below the gate oxide and field oxide associated therewith. Optionally, a high-voltage tank of the second conductivity type is used to contain the entire area of the device, including the first tank of the second conductivity type, and isolate it from the substrate to provide a high breakdown voltage. The transistor without the optional high-voltage tank is particularly appropriate for use as the low-side driver (LSD) portion of an H-bridge. For the high-side driver (HSD) portion of an H-bridge the device with the optional high-voltage tank of the second conductivity type is used. The LSD and HSD devices of the present invention may also be used as separate stand-alone devices.

8 Claims, 6 Drawing Sheets

LDMOS TRANSISTORS, SYSTEMS AND METHODS

This is a division of application Ser. No. 08/324,057, filed Oct. 14, 1994 now U.S. Pat. No. 5,585,294.

TECHNICAL FIELD OF THE INVENTION

The present invention relates to the field of semiconductor devices, processes for manufacturing those devices, and systems utilizing those devices.

BACKGROUND OF THE INVENTION

Power semiconductor devices are currently being used in many applications. Such power devices include high-voltage integrated circuits which typically include one or more high-voltage transistors, often on the same chip as low-voltage circuitry. A commonly used high-voltage component for these circuits is the lateral double diffused MOS transistor (LDMOS). LDMOS structures used in the high-voltage integrated circuits may generally be fabricated using some of the same techniques used to fabricate the low voltage circuitry or logic circuitry. In general, these existing LDMOS structures are fabricated in a thick epitaxial layer of opposite conductivity type to the substrate or they use a thin epitaxial layer and apply the RESURF principle to equally distribute the applied drain voltage laterally across the silicon surface in the drift region of the device.

High-power applications have called for the use of such lateral double diffused MOS transistors primarily because they possess lower "on" resistance, $R_{DS}(on)$, faster switching speed, and lower gate drive power dissipation than their bi-polar counterparts. These devices have heretofore also been strongly associated with bi-polar based process flows when integrated into a Bi-CMOS environment.

However, the presence of circuitry for digital and power switching functions on a chip with analog circuitry poses significant problems for precision analog circuitry because of the resulting mixed signal environment. For instance, switching noise in the digital and power areas can often be coupled into the analog sections via the substrate. That is, power switching injects current into the substrate that "bounces" all the other circuitry on the chip; however, reducing the resistance of the power transistor minimizes this effect. Secondly, a more frequent problem is that the analog sections operate with the dual supply bias-system while the digital portion utilizes a single supply bias scheme; this results in the need to do level shifting which complicates the design. One prior art technique uses a Bi-CMOS process with a unique isolation scheme such that the bi-polar layers can be used to construct a junction-isolated region to house any sensitive components.

The size and performance of the power IC devices (LDMOS devices) depends critically on a specific $R_{DS}(on)$ at a particular break-down voltage, BV, of the output devices. Since the field oxide thickness is usually limited by technological constraints, higher break-down voltages typically require more lightly doped layers. However, since the device on resistance, $R_{DS}(on)$, is proportional to the epitaxial layer resistivity, higher break-down voltages must generally be traded off for limited drive current capability. That is, the break-down voltage of the LDMOS transistor is optimized by adjusting the drift region epitaxial thickness but with increased resistivity due to more lightly doped layers; this optimization can also result from reduced surface fields (RESURF) techniques. However, the small drift region thickness required to obtain the optimum break-down voltage often results in an objectionable increase in the minimum on resistance, $R_{DS}(on)$, of RESURF devices.

The main objective of the design of the LDMOS device is to minimize "on" resistance, $R_{DS}(on)$, while still maintaining high break-down voltages. However, as noted earlier, these two electrical parameters tend to have conflicting requirements as far as processing variables such as epitaxial doping and thicknesses are concerned. Hence, the optimization of the LDMOS device is often a crucial step in the process design cycle.

Purely self-aligned LDMOS transistors, such as stand-alone devices fabricated by standard DMOS techniques, cannot be easily integrated into processes that include other low power devices because a layer of polysilicon (for the DMOS gate) is normally required early in the fabrication process to permit self-alignment of the source and backgate diffusions to the gate. The subsequent DMOS long source diffusion degrades a normal low power CMOS logic transistor fabricated during the same process. In addition, a purely photo-aligned device is difficult to control because the back gate leaves no marks for alignment and the channel length is dependent upon the alignment.

Heretofore most LDMOS structures built on a substrate along with one or more other device structures have been formed by first forming a high-voltage tank in the substrate. After the formation of the high-voltage tank a second low-voltage tank (typically used as the back gate) of opposite conductivity type to that of the first tank, was formed within the first high-voltage tank, and the active regions and gates were then aligned to these tanks. However, the alignment of these active regions and gates to the other existing structures, specifically, the high-voltage tank and the low-voltage tank is difficult. Current techniques use a hybrid of photo-alignment and self-alignment to fabricate these devices, such as taught in U.S. Pat. No. 5,242,841.

Most recently, LDMOS devices have been utilized in a single chip on a single substrate with a variety of logic devices, memory devices and other power devices capable of withstanding large transients. However, they also find use as a separate device for certain applications.

It is, therefore, desirable to be able to fabricate LDMOS devices that have an improved $R_{DS}(on)$ while maintaining a high break-down voltage. It is also desirable to be able to fabricate such an improved LDMOS device using steps in a process flow that are consistent with the fabrication of other high-power and low-power devices on a single chip.

SUMMARY OF THE INVENTION

According to one aspect of the present invention, a process for the fabrication of an improved LDMOS transistor, and such an improved LDMOS transistor are provided. The improved LDMOS transistor is in a semiconductor layer of a first conductivity type. The transistor has a source and drain of a second conductivity type (opposite the first conductivity type) and a channel of the first conductivity type with a conductive gate insulatively disposed over the channel. A low-voltage tank of the second conductivity type is used to contain the drain region (and the drain drift region) which because of its lower sheet resistance provides a lower $R_{DS}(on)$ for the device. This tank of the second conductivity type extends from the field oxide at the exterior perimeter of the drain region, joins with the channel region and extends below the gate oxide and field oxide associated therewith. That is, a semiconductor device having a first highly doped region of a conductivity type opposite that of the substrate formed in the face of said substrate, a second highly doped region of the conductivity type of said substrate formed in said first region, a third highly doped region of said conductivity type opposite that of said substrate formed in said second region, and a conductive gate having portions formed over said second and third regions and insulatively disposed thereon.

Optionally, a high-voltage tank of the second conductivity type is used to contain the entire semiconductor device, including the first tank of the second conductivity type, and isolate it from the substrate to provide a high breakdown voltage. That is, a semiconductor device having a first highly doped region of a conductivity type opposite that of the substrate formed in the face of said substrate, a second highly doped region of said conductivity type opposite that of said substrate formed in said first region, a third highly doped region of the conductivity type of said substrate formed in said second region, a fourth highly doped region of said conductivity type opposite that of said substrate formed in said third region, and a conductive gate having portions formed over at least a portion of said second, third and fourth regions and insulatively disposed thereon.

The semiconductor device structure without the optional high-voltage tank is particularly appropriate for use as the low-side driver (LSD) portion of an H-bridge. For the high-side driver (HSD) portion of an H-bridge the optional high-voltage tank of the second conductivity type is used to contain the device, including the low-voltage tank of the second conductivity type, and isolate it from the substrate to maintain a high breakdown voltage for the device. However, the LSD and HSD devices of the present invention may also be used as separate stand-alone devices in non-H-bridge applications.

H-bridges containing HSD and LSD devices of the present invention may be used in automotive systems, such as, for example, but not limited to, windshield wipers, power windows, power mirrors, gauges, etc. In addition, the individual HSD and LSD devices may also find uses in automotive systems, such as, for example, but not limited to, indicators, illumination devices, relays etc.

H-bridges containing HSD and LSD devices of the present invention may also be used in computer peripheral systems, such as, for example, but not limited to, printers, disc drives, etc. In addition, the individual HSD and LSD devices may also find uses in computer peripheral systems, such as, for example, but not limited to, indicators, illumination devices, coil drivers, relays, motor coils, etc.

The process employs an implant mask to define a tank of the second conductivity type to be located under the gate oxide and drain regions. This tank is dimensioned to enclose the source and drain regions of a transistor. More particularly, the process comprises forming a first region of a conductivity type opposite that of the substrate in a top surface of the substrate dimensioned to enclose source and drain regions of a transistor, introducing dopants of a first and second conductivity type having different diffusion rates into a second region centered in said first region, subjecting said substrate to an elevated temperature to form a third and fourth region from said dopants in said second region due to the different diffusion rates of said dopants, forming a gate structure adjacent to and partially overlapping said third region, and forming first and second source/drain regions adjacent opposite ends of said gate structure in said top surface of said substrate.

An additional process of the present invention comprises forming a first region of a conductivity type opposite that of the substrate in a top surface of the substrate dimensioned to enclose source and drain regions of a transistor, subjecting said substrate to a first elevated temperature, forming a second region of a conductivity type opposite that of the substrate in said first region, introducing dopants of a first and second conductivity type having different diffusion rates into a third region centered in said second region, subjecting said substrate to a second elevated temperature to form a fourth and fifth region from said dopants in said third region due to the different diffusion rates of said dopants, forming a gate structure adjacent to and partially overlapping said fourth region, and forming first and second source/drain regions adjacent opposite ends of said gate structure in said top surface of said substrate.

Another aspect of the present invention is a process flow which can be used to fabricate the improved power devices of the present invention, other power devices and non-power devices on a single substrate while maintaining superior performance. The process flow enhances the performance of the power devices while at the same time reducing the number of process steps by utilizing process steps to enhance the performance of the power devices that are also used to fabricate the non-power devices, without degrading the performance of the power devices.

BRIEF DESCRIPTION OF DRAWINGS

For a more complete understanding of the present invention, and the advantages thereof, reference is now made to the following description taken in conjunction with the accompanying drawings, in which.

DETAILED DESCRIPTION OF THE INVENTION

Figure 1A:
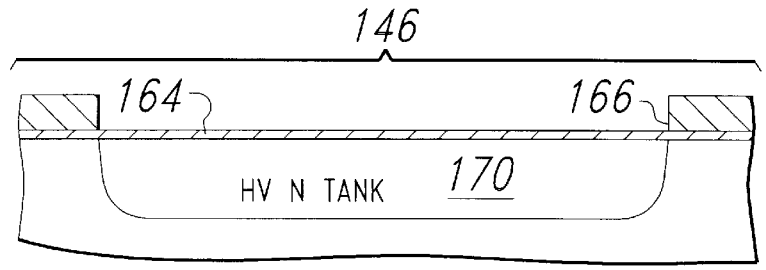
FIGS. 1A, 1B, 1C, 1D, 1E, 1F, 1G, 1H and 1I are highly magnified sectional views of the improved lateral DMOS transistor structures of the present invention, showing successive stages, some of which are optional, in the fabrication thereof.

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Moreover, while the present invention is illustrated by a number of preferred embodiments directed to silicon semiconductor devices, it is not intended that these illustrations be a limitation on the scope or applicability of the present invention. Further, while the illustrative examples use insulated gate control structures, it should be recognized that the insulated gate portions may be replaced with light activated or current activated structure(s). Thus, it is not intended that the semiconductor devices of the present invention be limited to the structures illustrated. These devices are included to demonstrate the utility and application of the present invention to presently preferred embodiments.

Further, various parts of the semiconductor elements have not been drawn to scale. Certain dimensions have been exaggerated in relation to other dimensions in order to provide a clearer illustration and understanding of the present invention. For the purposes of illustration the preferred embodiment of the semiconductor devices of the present invention have been shown to include specific P and N type regions, but it should be clearly understood that the teachings herein are equally applicable to semiconductor devices in which the conductivities of the various regions have been reversed, for example, to provide the dual of the illustrated device. Enhancement and depletion mode structures may be similarly interchanged.

Further, although the embodiments illustrated herein are shown in two dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

The fabrication steps for the structure of the devices of the present invention are consistent with the design rules for many different types of devices which maybe stored in a library, such as those illustrated for example, but not limited to, U.S. Pat. Nos. 5,242,841 (issued Sep. 7, 1993) and 5,296,393 (issued Mar. 22, 1994). These commonly owned and related cases provide unified sets of process parameters that can be applied to many different semiconductor devices. More particularly, these processes may be used to fabricate the improved devices of the present invention, as well as low-voltage PMOS devices, low-voltage NMOS devices, P-channel isolation or gating FETs, N-channel isolation or gating FETs, electrically programmable Fowler-Nordheim tunneling ROM cells, drain extended N-channel FETs, drain extended P-channel FETs, vertical DMOS devices, Schottky diodes, and FAMOS EPROM cells.

Again, while the processes for fabrication of the improved devices of the present invention are described in conjunction with fabrication of devices in P-type silicon substrate and expitaxial layers, these processes may also be applied to N-type semiconductor materials as well as to other types of semiconductors.

Initially, alignment marks are formed by etching targets (not shown) into a p-type semiconductor substrate having a protective oxide layer thereon. The alignment marks may be used to help define regions within the semiconductor substrate where different device types may be formed, and are preferably used to align the masks used to form any high-voltage tank and/or low-voltage tanks.

Referring now to FIG. 1A, there may be seen an optional high-voltage n-tank region 170; this region may be implanted for one type of improved LDMOS transistor 146 of the present invention. The term high-voltage denotes the voltages to which the devices formed in these tanks will be subjected; high voltages, such as twelve and eighteen volts, or transients up to about sixty volts, usually require larger and deeper tanks but with smaller (or lighter) dopant concentrations. Forming the improved LDMOS device of the present invention within a tank isolates the sources from the substrate allowing for a high-side driver circuit configuration. A high-side driver configuration consists of the LDMOS transistor whose drain is coupled to a power supply and the source coupled to an output load, as described more fully later herein.

Initially, an oxide layer 164 is grown on the surface of the substrate. A photo-resist layer 166 is then patterned to define the areas in which the high-voltage n-tank implant is to occur. The n-tank implant is then conducted, preferably with phosphorous at a dose of about $2.5 \times 10^{12}$ ions/cm$^2$ and at an energy of about 80 Kev. This creates the high-voltage (n__) tank region 170 which is partially driven in with a thermal step at about 1200° C. under an inert atmosphere for several hours.

It should be noted that the approximate implantation boundaries given in the illustrative sectional views of FIGS. 1A–1I are the boundaries obtained after all thermal steps of the fabrication process have been completed. However, at this early stage in the processing, the boundaries are not so deep or wide, and they approach the illustrated boundaries after subsequent thermal steps are performed on the semiconductor chip containing the devices of the present invention and any other devices fabricated concurrently therewith.

Figure 1B:
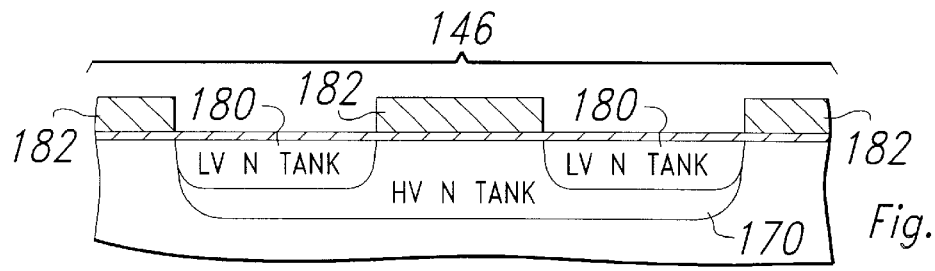

Following this thermal step, a photo-resist layer 182 is patterned to mask-off the rest of the chip except for the areas in which a low-voltage tank 180 is to be implanted. Then a low-voltage n-tank region 180 is implanted for the improved lateral DMOS transistor, as shown in FIG. 1B. The low-voltage n-tank implant is then performed, for example, with phosphorous at about $1 \times 10^{13}$ ions/cm$^2$ and an implantation energy of approximately 80 KeV. This implant step may also be used to form the backgate of any low voltage PMOS logic transistors being fabricated concurrently with the device of the present invention.

The high- and low voltage-tanks described herein differ in the dopant concentrations used to create them, and are thus implanted into the chip or substrate at different times. The high-voltage tanks are formed with a lower dopant concentration to preserve a high pn junction diode breakdown, but are deeper. The low-voltage tanks are shallower, but have a higher concentration of dopant.

Figure 1C:
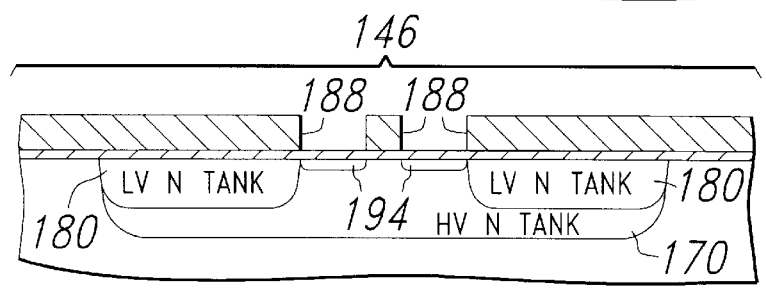

According to the process steps of the related patents discussed earlier herein, high-voltage p-tanks are implanted, followed by low-voltage p-tanks. These steps would be performed for any other devices being fabricated concurrently with the devices of the present invention. Turning next to FIG. 1C, the implantation of DWELL regions 194 for the improved lateral DMOS transistor of the present invention is shown. A photo-resist layer 188 is deposited on the surface and patterned to define the DWELL which form self-aligned (p−) and (n+) diffusions. The p− portion of the DWELL is preferably formed, for example, by implanting boron at about $1 \times 10^{14}$ ions/cm$^2$ and an implantation energy of approximately 40 KeV into the exposed portion and the n+ portion is preferably formed, for example, by implanting arsenic at about $1 \times 10^{15}$ ions/cm$^2$ and an implantation energy of approximately 120 KeV into the same exposed portion, to establish the DWELL regions; these DWELL regions are in the center of the high-voltage n-tank 170, when it is present, and in the center of and abutting the interior edge of the low-voltage n-tank 180 for the LDMOS devices 146 of the present invention. These DWELL regions serve as the back gate and source for the improved LDMOS transistors 146 of the present invention.

Figure 1D:
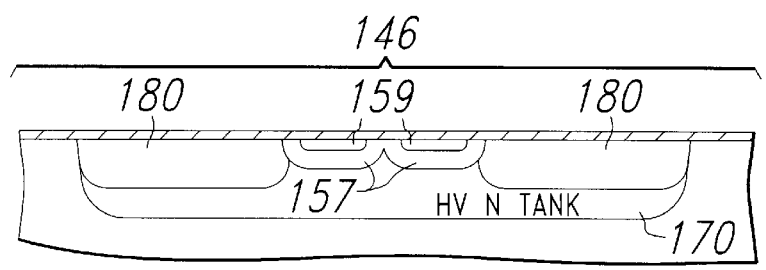

Following this a thermal drive step at about 1100° C. under an inert atmosphere for several hours is performed to drive in the diffusions to their nearly final depths and widths. FIG. 1D depicts the approximate boundaries of the n+ portion 159 of the DWELL and of the p− portion 157 of the DWELL following this thermal step.

Figure 1E:
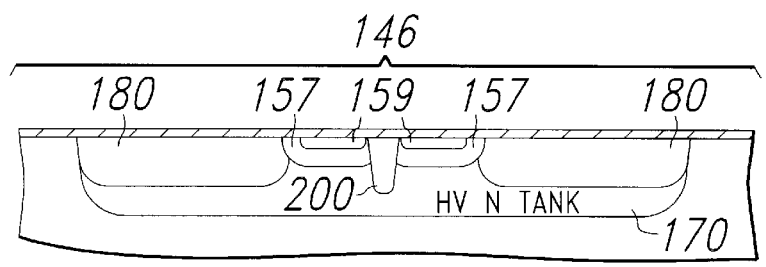

Turning next to FIG. 1E, another optional stage in the fabrication process of the present invention is further illustrated. Optionally, a layer of photo-resist (not shown) is next deposited on the chip and patterned for a deep (p+) diffusion 200. This may be performed, for example, with boron about $1 \times 10^{14}$ ions/cm$^2$ and at an implantation energy of approximately 40 KeV. This implantation step will produce the deep (p+) central region 200 which serves as the deep back gate contact for the device, which may be needed for devices fabricated using older technology; this deep back gate will probably be needed for older and wider devices as it reduces the back gate resistance.

Figure 1F:
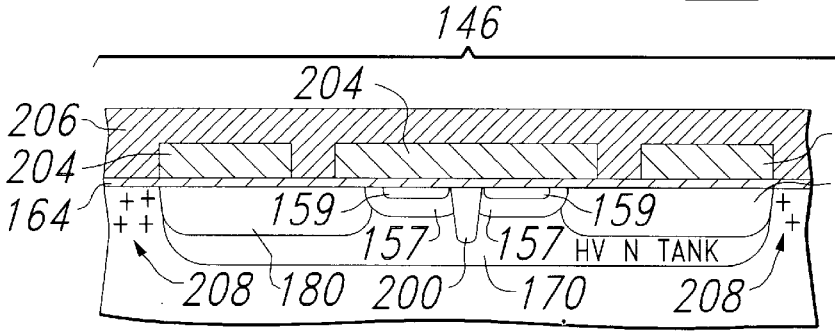

In FIG. 1F, a nitride/oxide mask 204 is formed, patterned and etched to produce a moat oxide mask 204. Active regions are fabricated by a standard local oxidation of silicon (LOCOS) process.

This moat mask 204 is augmented with a layer of patterned photo-resist 206 to form a mask for the implantation of (p+) channel stop regions 208, represented in FIG. 1F only by pluses (plus signs). The channel stop implant may be performed, for example, with a (p) type dopant, such as boron, at a dose of about $3 \times 10^{13}$ ions/cm$^2$ and at an energy of about 30 Kev. The channel stop implant is self-aligned to the active device areas and serves to augment the conductivity type of the (p−) epitaxial layer to (p) type in the implanted channel stop regions. This prevents the formation of parasitic transistors between devices.

Figure 1G:
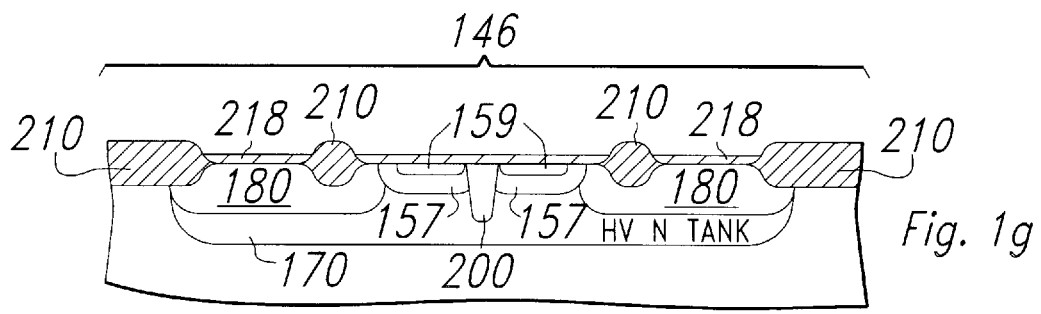

The photo-resist layer 206 is then stripped and the chip is subjected to a long thermal step in order to grow isolating oxide regions 210, as depicted in FIG. 1G. Localized oxidation occurs to a thickness of about 7600 Å under an oxidizing atmosphere such as steam for about nine to ten hours at about 900° C. The oxidation occurs in those areas left open by the nitride/oxide mask, as shown in FIG. 1G. After the growth of the isolating oxide regions 210, the mask 204 is removed. After a cleanup step, a dummy oxide layer (not shown) is grown on the exposed silicon surface to remove damaged material. This dummy oxide is then stripped.

A high-voltage gate oxide 218 is next grown on the surface of the tanks, as depicted in FIG. 1G. At this time a blanket $V_t$ implant, not shown, is performed with boron (about $3 \times 10^{11}$ ions/cm$^2$ at an energy of about 40 Kev.) into all the devices, including the devices of the present invention. Note that the field oxide is photo-aligned to the low voltage n-tank; the n-tank edge relative to the field oxide edge affects the DMOS breakdown voltage because of the surface potential controlled by the gate electrode (also known as gated diode breakdown).

Then a layer of photo-resist is deposited on the chip and patterned to expose the low-voltage n-tanks excluding tank 180. At this time a high-voltage n $V_t$ implant is performed with boron into the low-voltage n-tanks of low voltage logic devices. These tanks are implanted to alter the threshold voltage of the p-channel logic transistors by forming a (p−) region at the surface of the device that is self-aligned to the active areas by the field oxide. Next, a low-voltage $V_t$ adjust implant, not shown, may be performed into the n+ portion of the DWELLs of other devices.

Figure 1H:
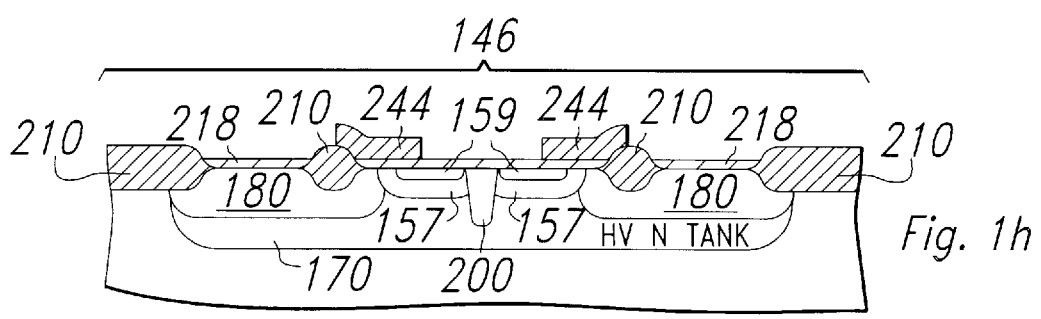
Figure 1I:
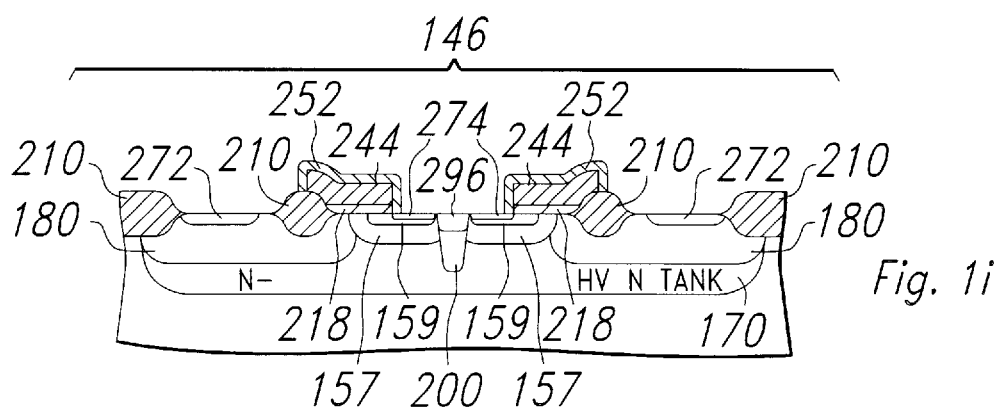

Further steps for the fabrication of these devices are shown in FIG. 1H. A second layer of polycrystalline silicon (not shown) is deposited, doped, patterned and etched to form (n+) annular poly gate 244 for device 146. This may be accomplished, for example, using silane as the depositing agent at about 625° C. The poly layer is then doped with phosphorous to render it conductive with, for example, POCl$_3$ in a thermal step at about 900° C. with nitrogen and oxygen present. The layer is also deglazed. In FIG. 1I, sidewall oxide structures 252 are added to poly gate 244 by anisotropically etching back a thick layer of oxide deposited on the chip. This is followed by growing the cap oxide 252 on the exposed surfaces of the polysilicon gate 244 under an oxygen atmosphere.

A layer of photo-resist (not shown) is used to define a plurality of n-type source/drain implants. The contact portion of these regions is self-aligned to the corresponding sidewall oxide or moat oxide structures (the source region area is not self-aligned with the poly layer since it partially extends under the field oxide). A first, low density diffusion source/drain (n) implant, the so-called LDD implant, is made with phosphorous into the annular source/drain regions 272 near the periphery of the low-voltage n-tank 180 and into source/drain region 274 which is in the DWELL region. This implantation may be made at a dose of about $4 \times 10^{14}$ ions/cm$^2$ and at an energy of approximately 80 Kev.

This LDD implantation is immediately followed with a main (n+) source/drain implant, which is preferably an arsenic implantation, using the same patterned photo-resist layer (not shown). This implantation may be made at a dose of about $5 \times 10^{15}$ ions/cm$^2$ and at an energy of approximately 120 Kev. These two implantations are annealed at about 900° C. for about half an hour under a nitrogen atmosphere to obtain the implantation boundaries shown. A portion of the phosphorous dopant diffuses partially under respective gate oxides for the device 146.

Another layer of photo-resist (not shown) is patterned for any (p+) source/drain implants and the implanting of a deep (p+) contact region 296. The deep (p+) contact region is substantially coincident with the lateral facial margins of the deep (p+) region 200.

The n-type source/drain implantation step is further used to form surface contact regions for back gates for p-channel transistors and a (p+) source/drain implantation step is used to form surface contact regions for back gates for any n-channel transistors being simultaneously fabricated with the devices of the present invention.

The formation of the semiconductor devices is now virtually complete but they must be interconnected with each other and the outside world. An oxide layer (not shown) is deposited, patterned and etched to provide contact windows to which metal for interconnections or outside world connections will be made. Typically, platinum is deposited to form PtSi at each contact window.

End process steps, including deposition of mid-level insulator, first level metal, second mid-level insulator, and second level metal are performed according to processes well known in the art and so will not be described herein.

Figure 2:
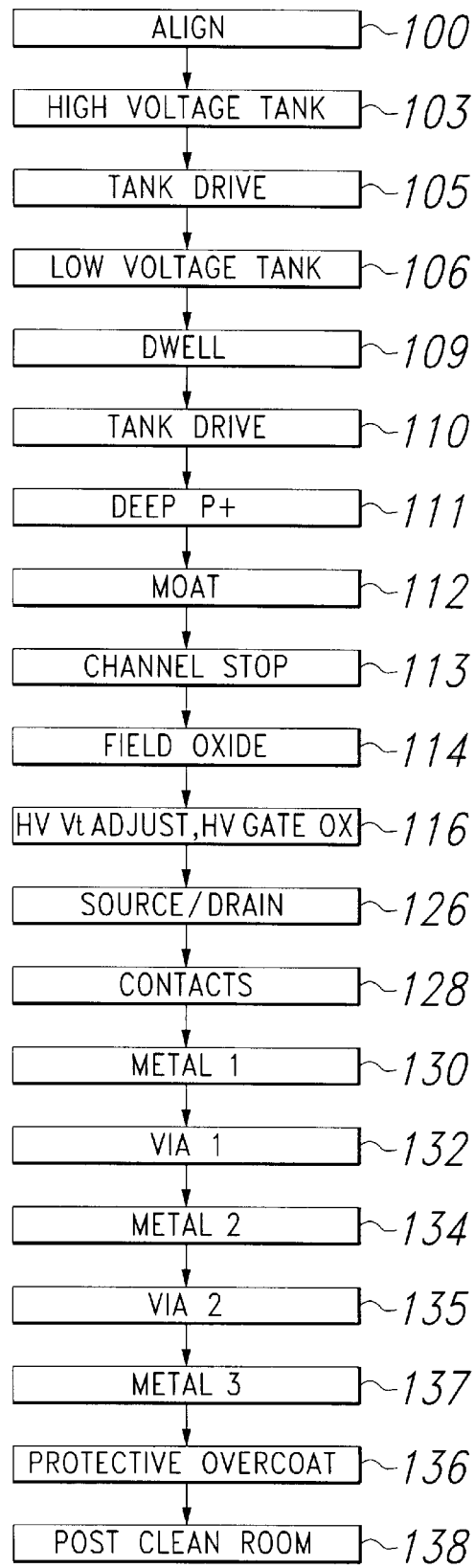
FIG. 2 is a process flow for fabricating devices of the present invention.

In summary, the main process steps of the present invention for producing devices of the present invention are depicted in FIG. 2; these steps use the same numbering scheme of FIG. 1 of U.S. Pat. No. 5,242,841 since they are consistent therewith. Referring now to FIG. 2 it may be seen that the initial step is an alignment step 100. Optionally, a high voltage tank region of an n conductivity type (opposite that of the substrate) 104 is then formed in a top surface of the substrate dimensioned to enclose the device. When this high voltage tank step 104 is employed a tank drive 105 is performed by subjecting the substrate and tank to a first elevated temperature to partially drive in the tank. Next a low voltage tank 106 of an n conductivity type (opposite that of the substrate) is formed in the high voltage tank, when the high voltage tank is present; the low voltage tank is dimensioned to enclose the source and drain regions of the device. Following this a DWELL 109 is formed by introducing dopants of a first and second conductivity type having different diffusion rates into a third region centered in the low voltage tank to form the DWELL. A second tank drive 110 is then performed by subjecting the substrate to a second elevated temperature to form the DWELL from the dopants in the third region (due to the different diffusion rates of the dopants) and drive in the tank(s). Optionally, a deep p+ implant 111 may be formed. Following this, various steps are performed to provide moats 112, channel stop 113, and field oxide 114, as well as blanket Vt adjusts 116. Next, a gate oxide 116 is formed to provide a gate structure adjacent to and partially overlapping a portion of the DWELL. Finally the source/drain regions 126 are formed adjacent opposite ends of the gate structure in the top surface of the substrate. After this contacts 128, various metallization 130, 132, 134, 135, 137, protective 136 and cleanup 138 steps are performed.

Figure 3A:
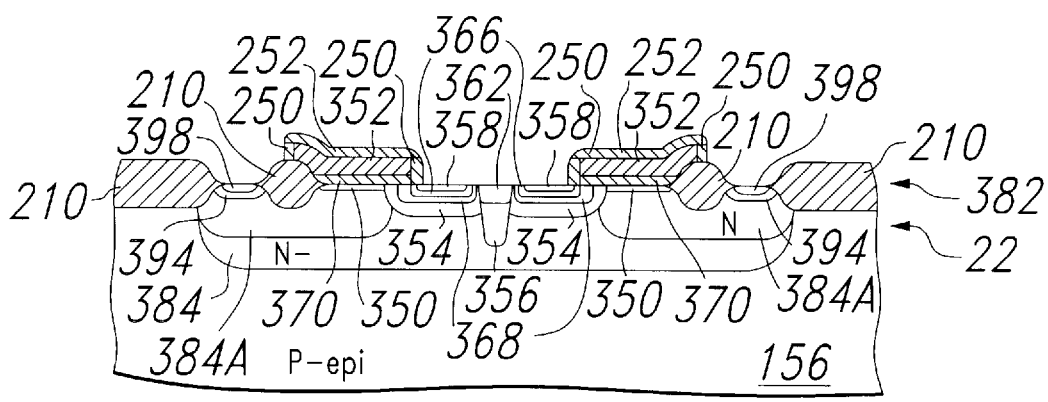
FIG. 3A is a sectional view of one of the improved lateral DMOS transistor structures of the present invention.

Referring now to FIG. 3A, there may be seen a detailed sectional view of one device of the present invention. More particularly, the structure of a device suitable for use as a high side driver (HSD) is depicted. As shown the device has a high voltage and low voltage n-tank 384 and 384A, respectively, in a p– epi layer 156. A DWELL p– portion 354 is depicted in the center of these tanks that has an optional deep p+ implant 356 that serves as a back gate region. A DWELL n+ portion 368 may also be seen in the center of the tanks. Source/drain regions 394/398 and 358/366 are also depicted, which contain various n implants. A high voltage Vt implant 350 is depicted under gate oxide layer 370. A poly gate 352 is shown over the oxide layer 370. The poly gate 352 has a sidewall oxide 250 and an oxide cap 252. A Field oxide 210 is also shown.

Figure 3B:
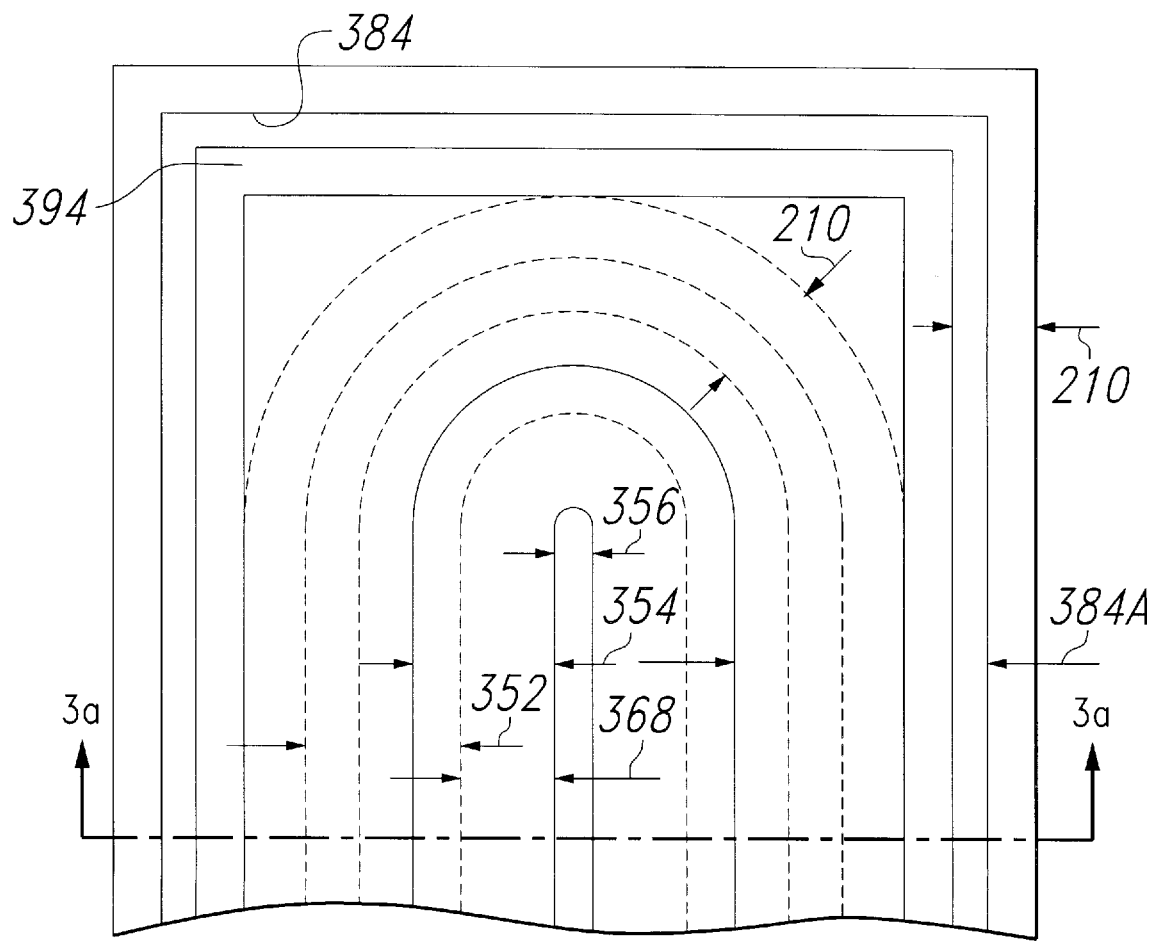
FIG. 3B is a plan view of the improved lateral DMOS transistor structure of FIG. 3A.

A schematic plan view of the improved LDMOS transistor of FIG. 3A is shown in FIG. 3B. The outer implantation limits of the n-tanks 384 and 384A are shown by the solid line rectangle. The DWELL 354 implantation mask limit is shown by a labelled solid line. The optional deep (p+) diffusion region 356 occupies the center portion of the implantation area for the DWELL 354. The source/drain regions are 394 and 368. The source/drain region 394 is defined by the moat oxide 210 on both sides. The poly 2 gate 352 is accompanied by the sidewall oxide regions 250 and oxide caps 252. The poly gate 352 is extended to a pad (not shown), and a contact (not shown) is made to the pad from a first metal (not shown). Appropriate contacts (not shown) are made from various regions 398, 358, 362 to respective first level metal lines (not shown).

Figure 4A:
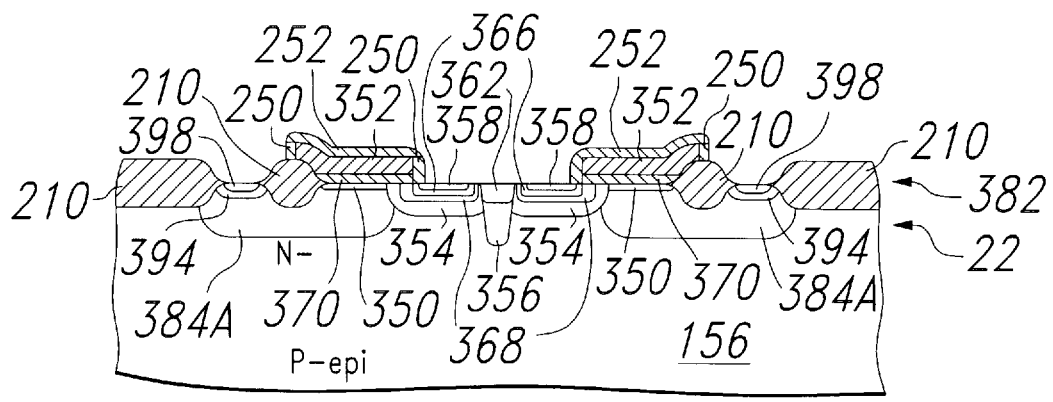
FIG. 4A is a sectional view of another improved lateral DMOS transistor structure of the present invention.

Referring now to FIG. 4A, there may be seen a detailed sectional view of another device of the present invention. More particularly, the structure of a device suitable for use a low side driver (LSD) is depicted. As shown the device has a low voltage n– tank 384A in a p–epi layer 156. A DWELL p– region 354 is depicted in the center of this tank and has an optional deep p+ implant 356 that serves as a back gate region. Source/drain regions 394/398 and 358/366 are also depicted, which contain various n implants. A high voltage Vt implant 350 is depicted under gate oxide layer 370. A poly gate 352 is shown over the oxide layer 370. The poly gate 352 has a sidewall oxide 250 and an oxide cap 252. A Field oxide 210 is also shown.

Figure 4B:
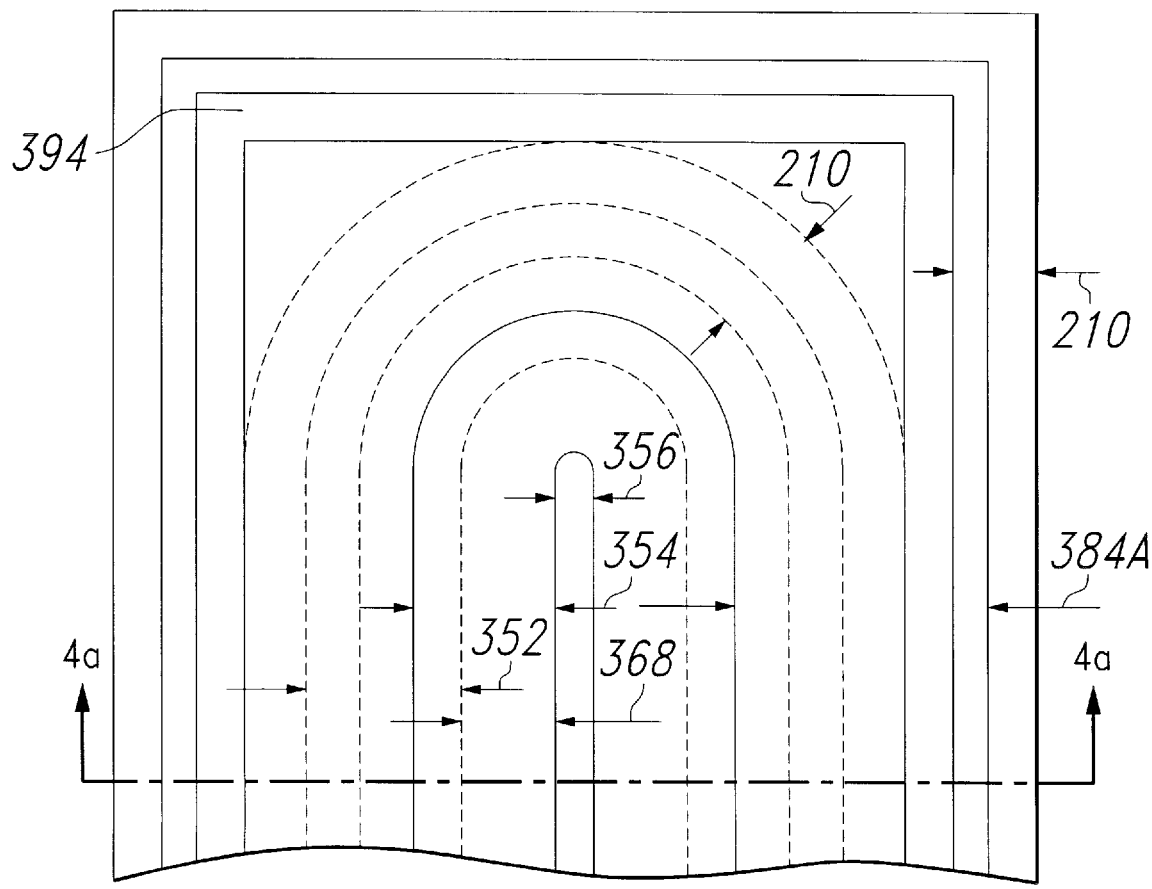
FIG. 4B is a plan view of the improved lateral DMOS transistor structure of FIG. 4A.

A schematic plan view of the improved LDMOS transistor of FIG. 4A is shown in FIG. 4B. The implantation limits of the n– tank 384A are shown by the solid line rectangle. The DWELL p– region 354 implantation mask limit is shown by a labelled solid line. The optional deep (p+) diffusion region 356 occupies the center portion of the implantation area for the DWELL p– region 354. The source/drain regions are 398/394 and 358/366. The source/drain region 398/394 is defined by the moat oxide 210 on both sides. The poly 2 gate 352 is accompanied by the sidewall oxide regions 250 and oxide cap 252. The poly gate 352 is extended to a pad (not shown), and a contact (not shown) is made to the pad from a first metal (not shown). Appropriate contacts (not shown) are made from various regions 398, 358, 362 to respective first level metal lines (not shown).

The LDMOS structures of FIGS. 3A, 3B, 4A, and 4B are double-diffused source/back gate with a well controlled channel length. Gate overlap of the source depends, on photo-alignment, which is excellent for submicron class steppers. The LDMOS transistor has a (p–) region extending to the edge of the drain-side field oxide as a consequence of the blanket (unpatterned) (p–) implant used to adjust high voltage MOS threshold voltages. The (n) source/drain regions are double diffused (n+/n–). The sidewall oxide on the source-side of the poly gate self aligns the heavily doped regions of the source to the gate. The metal 1 layer normally runs along the device parallel to the poly gate and metal 2 can run either parallel or perpendicular to the gate poly, as a function of chip global routing to bond pads. Termination of the implants and wells are semicircular to increase breakdown voltages. However, since the high voltage Vt implant is unpatterned it does not appear on the plan views.

When the expitaxial layer 152 is p–, the backgates of the n– channel transistors are common. The n– tanks 384/384A give an extra PN junction for isolation, allowing the use of negative voltages with respect to the expitaxial layer 152; that is the source may be driven negative and the device still operate. Further, the enclosing HV n-tank 384 gives additional protection from transient voltages. This makes the isolated transistors especially useful for automobile microcontrollers and other chips subject to 60 volt transient voltages.

The early implementation of the (n+) regions 384/384A provide an alignment insensitive DMOS channel length in a process compatible with CMOS logic and EEPROM and EPROM cells. That is, the channel length created by the DWELL (p–) regions 354 is made independent of the position of the annular gates 352.

In addition, for single devices that employ the structures of the present invention, it is not necessary to perform the normal double diffusions associated with the last implants; that is single diffusion implants on the surface will work for the surface contacts. The double diffusion surface contacts are required when the power devices are included on the same chip with other power and low-voltage devices.

An advantage of the structure of the present invention is that the $R_{DS}$(on) value may be suitably adjusted while leaving the break-down voltage at a very high level. By employing the structure of the present invention, it is possible to use less chip area to achieve the same low $R_{DS}(on)$ that would require larger areas for structures that do not employ the teachings of the present invention.

In general, existing LDMOS structures are fabricated in a thick epitaxial layer of opposite conductivity type to the substrate or they use a thin epitaxial layer and apply the RESURF principle to equally distribute the applied drain voltage laterally across the silicon surface in the drift region of the device. The drain structure of the present invention also works with conventional "self-aligned" source structures.

Figure 5:
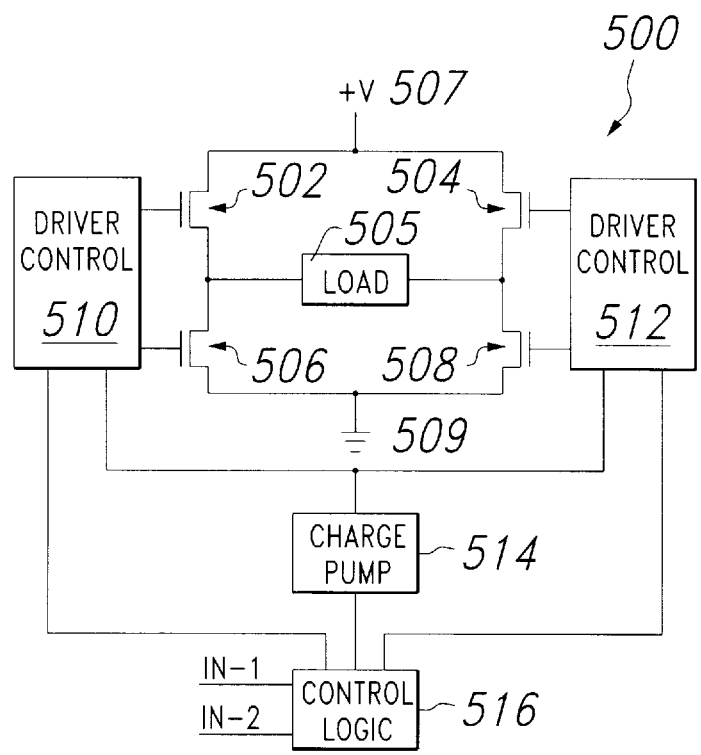
FIG. 5 is an electrical schematic block diagram of an H-bridge.

Referring now to FIG. 5 there may be seen a block diagram of an H-bridge 500 with control circuitry for use in various applications, such as, for example, but not limited to, an automotive application. Such an application might include, but is not limited to, operation of power windows, power mirrors or windshield wipers. An exemplary layout of the H-bridge DMOS drivers 502, 504, 506, 510, with control and support circuitry 510, 512, 514, 516 illustrated as blocks, is shown in FIG. 5; other typical circuitry, such as, for example, but not limited to an over-temperature shutdown, open circuit detection and over-current detection, may also be included as part of the control and support circuitry 510, 512, 514, 516.

FIG. 5 depicts two HSD devices 502, 504, and two LSD devices 506, 508, operatively interconnected with a load 505, power source 507 and ground 509. The device control circuitry 510, 512, 514, 516, is illustrated as blocks and are used to turn on the appropriate diagonal LSD and HSD pair to drive the load 505 in the desired direction. That is, either HSD 502 and LSD 508 are turned on providing current flow in one direction, or HSD 504 and LSD 506 are turned on providing current flow in the opposite direction. The charge pump 514, is used to increase the voltage on the gate of an HSD or LSD device and thereby decrease the resistance of the device when it switches on. The device control circuitry 510, 512, and charge pump 514, are responsive to control logic circuitry 516. The control logic circuitry 516, is in turn responsive to its input signals. Such an H-bridge 500, may be used, for example, to control a motor which must be driven in two different directions; such a motor might control a window or mirror for an automobile door. In addition, two such H-bridges 500, may be used to control the two positioning windings for indicators of gauges that move in both directions.

The circuit of FIG. 5 utilizes on-board charge pumping to achieve a higher gate-to-source bias than without the charge pump, thereby minimizing the $R_{DS}(on)$ X area of the low side driver (LSD) LDMOS device. In fact, only one charge pump is used, since at any one time only 2 DMOS devices, one HSD and one LSD, are active. For this particular embodiment, the silicon overhead associated with the charge pump should be more than offset by the reduction in the $R_{DS}(on)$ X area due to the higher $V_{GS}$ bias.

Further, there are non-automotive applications for H-bridges. For example, two H-bridges 500, may be used to control the stepper of a printer or disc drive. Thus, the devices of the present invention may also be used for various computer peripherals.

Figure 6:
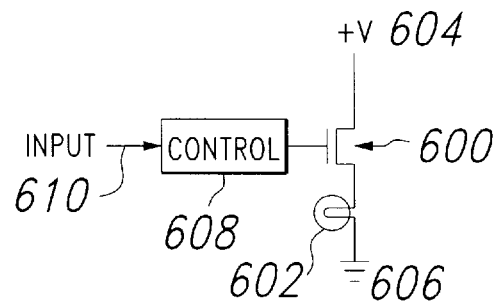
FIG. 6 is an electrical schematic block diagram employing a high-side driver of the present invention to selectively power an electric bulb.

In addition to the H-bridge which may use both of the structures of the present invention, other applications may employ these structures individually as stand-alone devices. For example, in an automotive context, the HSD structure 600, may be used to energize or power a lamp or bulb 602, as depicted in FIG. 6. However, for certain applications where the length of the wire 603, running from the LDMOS device 600, to the bulb 602, is short, it may be appropriate to use the LSD structure. Typically, several of these individual LSD and/or HSD devices are packaged together. Thus, the individual devices may be used to provide status information or illumination to a specific area.

Although the present invention and its advantages have been described in detail, it should be understood that various changes, substitutions and alterations may be made herein without departing from the spirit and scope of the invention, as defined by the appended claims.

What is claimed is:

1. An LDMOS transistor, comprising:
    a substrate having a first conductivity type;
    a low-voltage tank having a first concentration of a second conductivity type opposite that of said first conductivity type formed in a face of said substrate such that a drift region is included within said low-voltage tank;
    a back gate region of said first conductivity type formed adjacent to and in contact with said low-voltage tank, such that a major portion of the backgate region is not within the low-voltage tank;
    a source region of said second conductivity type formed within said back gate region, such that a channel region exists in said back-gate region between said low-voltage tank and said source region;
    a conductive gate having portions formed over a portion of said low-voltage tank, said back gate region, and said source region and insulatively disposed thereon; and
    a first source/drain region in said low-voltage tank and a second source/drain region in said source region adjacent opposite ends of said gate structure in said face of said substrate, whereby said LDMOS transistor is suitable as a low side driver.

2. The LDMOS transistor of claim 1, further comprising:
    a high-voltage tank having a second concentration of said second conductivity type enclosing said LDMOS transistor and conductively isolating it from said substrate; and
    wherein said second concentration is lower than said first concentration of said low voltage tank, whereby said LDMOS transistor is suitable as a high side driver.

3. An H-bridge circuit, comprising;
    a first high side driver (HSD) with a first HSD drain connected to a first terminal for a first voltage source, a first HSD source, and a first HSD gate;
    a first low side driver (LSD) with a first LSD drain connected to said first HSD source and to a first load terminal, a first LSD source connected to a second terminal for a second voltage source, and a first LSD gate;
    a second high side driver (HSD) with a second HSD drain connected to said first terminal, a second HSD source, and a second HSD gate;
    a second low side driver (LSD) with a second LSD drain connected to said second HSD source and to a second load terminal, a second LSD source connected to said second terminal, and a second LSD gate;
    wherein said first low side driver and said second low side driver each further comprise a substrate having a first conductivity type; a low-voltage tank having a first concentration of a second conductivity type opposite that of said first conductivity type formed in a face of said substrate such that a drift region is included within said low-voltage tank; a back gate region of said first conductivity type formed adjacent to and in contact with said low-voltage tank; a source region of said second conductivity type formed within said back gate region, such that a channel region exists in said back-gate region between said low-voltage tank and said source region; said LSD gate having portions formed over a portion of said low-voltage tank, said back gate region, and said source region and insulatively disposed thereon; and said LSD drain in said low-voltage tank and said LSD source in said source region adjacent opposite ends of said gate structure in said face of said substrate; and wherein said first high side driver and said second high side driver each further comprise a substrate having said first conductivity type; a low-voltage tank having a first concentration of said second conductivity type opposite that of said first conductivity type formed in a face of said substrate such that a drift region is included within said low-voltage tank; a back gate region of said first conductivity type formed adjacent to and in contact with said low-voltage tank; a source region of said second conductivity type formed within said back gate region, such that a channel region exists in said back-gate region between said low-voltage tank and said source region; said HSD gate having portions formed over a portion of said low-voltage tank, said back gate region, and said source region and insulatively disposed thereon; said HSD drain in said low-voltage tank and said HSD source in said source region adjacent opposite ends of said gate structure in said face of said substrate; and a high-voltage tank having a second concentration of said second conductivity type enclosing said high side driver and conductively isolating it from said substrate; and wherein said second concentration is lower than said first concentration;

whereby an external load can be connected between said first load terminal and said second load terminal.

4. The H-bridge circuit of claim 3, wherein said first high side driver, said first low side driver, said second high side driver and said second low side driver are formed on a common substrate.

5. The H-bridge circuit of claim 4, further comprising:

a first driver control circuitry connected to said first HSD gate and to said first LSD gate operable to turn on said first HSD while turning off said first LSD;

a second driver control circuitry connected to said second HSD gate and to said second LSD gate operable to turn off said second HSD while turning on said second LSD.

6. The H-bridge circuit of claim 5, further comprising control logic circuitry connected to said first driver control circuitry and to said second driver control circuitry having at least one control signal input and operable to turn on said first HSD and said second LSD while turning off said second HSD and said first LSD in response to said control signal.

7. The H-bridge circuit of claim 6, further comprising a charge pump circuitry connected to said control circuitry operable to increase a gate-to-source bias on at least said first HSD and said second LSD.

8. The H-bridge circuit of claim 6, further comprising a motor connected between said first load terminal and said second load terminal, wherein said motor is operable to be driven in two different directions in response to said control signal.

* * * * *